United States Patent
Yang et al.

(10) Patent No.: US 11,387,310 B2
(45) Date of Patent: Jul. 12, 2022

(54) ARRAY SUBSTRATE WITH CONNECTION PORTION CONNECTING POWER BUS AND POWER LINE AND DISPLAY PANEL

(71) Applicants: Chengdu BOE Optoelectronics Technology Co., Ltd., Sichuan (CN); BOE TECHNOLOGY GROUP CO., LTD., Beijing (CN)

(72) Inventors: Huijuan Yang, Beijing (CN); Tingliang Liu, Beijing (CN); Gen Li, Beijing (CN); Yang Zhou, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 139 days.

(21) Appl. No.: 16/963,683

(22) PCT Filed: Oct. 14, 2019

(86) PCT No.: PCT/CN2019/111036
§ 371 (c)(1),
(2) Date: Jul. 21, 2020

(87) PCT Pub. No.: WO2021/072596
PCT Pub. Date: Apr. 22, 2021

(65) Prior Publication Data
US 2022/0005912 A1 Jan. 6, 2022

(51) Int. Cl.
*H01L 29/08* (2006.01)
*H01L 27/32* (2006.01)

(52) U.S. Cl.
CPC ...... *H01L 27/3276* (2013.01); *H01L 27/3218* (2013.01); *H01L 27/3262* (2013.01); *H01L 27/3265* (2013.01)

(58) Field of Classification Search
CPC ............ H01L 27/3276; H01L 27/3218; H01L 27/3262; H01L 27/3265
USPC ......................................... 257/40
See application file for complete search history.

(56) References Cited

U.S. PATENT DOCUMENTS

2010/0315400 A1* 12/2010 Choi .................... G09G 3/3611 345/98
2016/0293889 A1* 10/2016 Nakamura .......... H01L 51/5253
2017/0132971 A1* 5/2017 Inoue ................... G09G 3/2003
(Continued)

*Primary Examiner* — Phuc T Dang
(74) *Attorney, Agent, or Firm* — Collard & Roe, P.C.

(57) ABSTRACT

An array substrate and a display panel are disclosed. The array substrate includes: a base substrate including a display region and a peripheral region; a plurality of sub-pixels in the display region; a plurality of data lines in the display region; a plurality of first power lines in the display region; a plurality of data lead lines in the peripheral region; a plurality of selection switches in the peripheral region; a plurality of data signal input lines in the peripheral region; a first power bus in the peripheral region; and a plurality of connection portions electrically connecting the first power bus to the plurality of first power lines, respectively. The plurality of connection portions include a plurality of first connection portions and a plurality of second connection portions on both sides of the plurality of first connection portions.

20 Claims, 10 Drawing Sheets

(56) References Cited

U.S. PATENT DOCUMENTS

2020/0133085 A1\* 4/2020 Shirai ..................... G09G 3/20
2021/0125566 A1\* 4/2021 Yang .................... G09G 3/3275

\* cited by examiner

ARRAY SUBSTRATE WITH CONNECTION PORTION CONNECTING POWER BUS AND POWER LINE AND DISPLAY PANEL

CROSS REFERENCE TO RELATED APPLICATIONS

This application is the National Stage of PCT/CN2019/111036 filed on Oct. 14, 2019, the disclosure of which is incorporated by reference.

TECHNICAL FIELD

Embodiments of the present disclosure relate to an array substrate and a display panel.

BACKGROUND

Organic light-emitting diode (OLED) display panels have advantages of the self-luminescence, high contrast, high definition, wide viewing angle, low power consumption, fast response speed, low manufacturing cost, etc., and have become an important development direction of new generation display devices, so that OLED display panels are getting more and more attention.

For OLED display panels, the screen ratio is one of important considerations. The high screen ratio means that the effective display area is larger in display panels of the same size, which can provide a better visual experience.

SUMMARY

At least one embodiment of the present disclosure provides an array substrate, the array substrate comprises:
a base substrate comprising a display region and a peripheral region at least on one side of the display region;
a plurality of sub-pixels in the display region;
a plurality of data lines in the display region and configured to provide data signals for the plurality of sub-pixels;
a plurality of first power lines in the display region and configured to provide power signals for the plurality of sub-pixels;
a plurality of data lead lines in the peripheral region and electrically connected to the plurality of data lines, respectively;
a plurality of selection switches in the peripheral region and arranged at intervals, in which the plurality of selection switches are on a side of the plurality of data lead lines away from the display region, and at least one of the plurality of selection switches is electrically connected to at least two data lead lines of the plurality of data lead lines;
a plurality of data signal input lines in the peripheral region and on a side of the plurality of selection switches away from the display region, in which at least one of the plurality of selection switches is electrically connected to one of the plurality of data signal input lines;
a first power bus in the peripheral region and on a side of the plurality of selection switches away from the display region; and
a plurality of connection portions electrically connecting the first power bus to the plurality of first power lines, respectively, in which the plurality of connection portions extend along a region between the plurality of selection switches, and the plurality of connection portions comprise a plurality of first connection portions and a plurality of second connection portions on both sides of the plurality of first connection portions.

For example, in the array substrate provided by at least one embodiment of the present disclosure, in an extending direction of an edge of the display region adjacent to the plurality of connection portions, a width of the first connection portion is greater than a width of the second connection portion.

For example, in the array substrate provided by at least one embodiment of the present disclosure, in an extending direction of an edge of the display region adjacent to the plurality of connection portions, the plurality of selection switches and the plurality of connection portions are arranged alternately, one connection portion is arranged between two adjacent selection switches, and one selection switch is arranged between two adjacent connection portions.

For example, in the array substrate provided by at least one embodiment of the present disclosure, one selection switch and one connection portion that are adjacent are taken as an arrangement period, and a width of a first arrangement period fumed by one first connection portion and one selection switch that are adjacent is greater than a width of a second arrangement period formed by one second connection portion and one selection switch that are adjacent.

For example, in the array substrate provided by at least one embodiment of the present disclosure, the plurality of selection switches comprise a plurality of first selection switches and a plurality of second selection switches on both sides of the plurality of first selection switches, and in an extending direction of an edge of the display region adjacent to the plurality of connection portions, a width of the first selection switch is smaller than a width of the second selection switch.

For example, in the array substrate provided by at least one embodiment of the present disclosure, the second connection portion comprises at least two sub-connection portions in different layers.

For example, in the array substrate provided by at least one embodiment of the present disclosure, at least one of the plurality of sub-pixels comprises a driving thin film transistor and a storage capacitor; the driving thin film transistor comprises a driving active layer on the base substrate, a driving gate electrode on a side of the driving active layer away from the base substrate, a gate insulating layer on a side of the driving gate electrode away from the base substrate, an interlayer dielectric layer on a side of the gate insulating layer away from the base substrate, and a driving source electrode and a driving drain electrode on a side of the interlayer dielectric layer away from the base substrate; and the storage capacitor comprises a first capacitor electrode and a second capacitor electrode, the first capacitor electrode and the driving gate electrode are in an identical layer, and the second capacitor electrode is between the gate insulating layer and the interlayer dielectric layer.

For example, in the array substrate provided by at least one embodiment of the present disclosure, the second connection portion comprises a first sub-connection portion and a second sub-connection portion in different layers, the first sub-connection portion and the driving gate electrode are in an identical layer, and the second sub-connection portion and the second capacitor electrode are in an identical layer.

For example, in the array substrate provided by at least one embodiment of the present disclosure, the plurality of first connection portions and the driving gate electrode are in an identical layer.

For example, in the array substrate provided by at least one embodiment of the present disclosure, in an extending direction of an edge of the display region adjacent to the plurality of connection portions, a width of the first sub-connection portion is identical to a width of the second sub-connection portion, and is a first width, and a width of the first connection portion is a second width, the first width smaller than the second width.

For example, in the array substrate provided by at least one embodiment of the present disclosure, the first width is half of the second width.

For example, in the array substrate provided by at least one embodiment of the present disclosure, the first connection portion comprises a third sub-connection portion and a fourth sub-connection portion in different layers, the third sub-connection portion and the first sub-connection portion are in an identical layer, and the fourth sub-connection portion and the second sub-connection portion are in an identical layer.

For example, in the array substrate provided by at least one embodiment of the present disclosure, in an extending direction of an edge of the display region adjacent to the plurality of connection portions, a width of the first sub-connection portion is identical to a width of the second sub-connection portion, and is a first width, and a width of the third sub-connection portion is identical to a width of the fourth sub-connection portion, and is a third width, the first width is smaller than or equal to the third width.

For example, in the array substrate provided by at least one embodiment of the present disclosure, an orthographic projection of the first sub-connection portion on the base substrate at least partially overlaps with an orthographic projection of the second sub-connection portion on the base substrate, and an orthographic projection of the third sub-connection portion on the base substrate at least partially overlaps with an orthographic projection of the fourth sub-connection portion on the base substrate.

For example, the array substrate provided by at least one embodiment of the present disclosure further comprises a second power bus between the plurality of selection switches and the display region, in which both ends of at least one connection portion of the plurality of connection portions are electrically connected to the first power bus and the second power bus, respectively.

For example, in the array substrate provided by at least one embodiment of the present disclosure, the first power bus, the second power bus, and the plurality of connection portions define a plurality of first openings arranged in an array, and orthographic projections of the plurality of selection switches on the base substrate are within orthographic projections of the plurality of first openings on the base substrate, respectively.

For example, in the array substrate provided by at least one embodiment of the present disclosure, the first power bus, the second power bus, the driving source electrode, and the driving drain electrode are in an identical layer.

For example, in the array substrate provided by at least one embodiment of the present disclosure, the selection switch comprises: a first active layer on the base substrate; a first gate electrode and a second gate electrode on a side of the first active layer away from the base substrate, in which the first gate electrode and the second gate electrode are in an identical layer and do not overlap with each other; and a first source electrode, a first drain electrode, and a second drain electrode on a side of the first gate electrode and the second gate electrode away from the base substrate, in which the first source electrode, the first drain electrode, and the second drain electrode are in an identical layer and do not overlap with each other, and the first source electrode is between the first drain electrode and the second drain electrode; and the first source electrode is electrically connected to one data signal input line of the plurality of data signal input lines, and each of the first drain electrode and the second drain electrode is electrically connected to one data lead line of the plurality of data lead lines.

For example, in the array substrate provided by at least one embodiment of the present disclosure, the first gate electrode, the second gate electrode, and the driving gate electrode are in an identical layer, and the first source electrode, the first drain electrode, the second drain electrode, the driving source electrode, and the driving drain electrode are in an identical layer.

For example, in the array substrate provided by at least one embodiment of the present disclosure, the plurality of data signal input lines comprise a first data signal input line and a second data signal input line, the first data signal input line and the second data signal input line are alternately arranged, and the first data signal input line and the second data signal input line are in different layers.

For example, in the array substrate provided by at least one embodiment of the present disclosure, the plurality of data lead lines and the driving gate electrode are in an identical layer.

For example, in the array substrate provided by at least one embodiment of the present disclosure, the array substrate has an arc-shaped edge, and the second connection portion is in the peripheral region close to the arc-shaped edge.

For example, in the array substrate provided by at least one embodiment of the present disclosure, a planar shape of the array substrate is a rectangle shape, four corners of the rectangle shape are arc corners, and the second connection portion is in a region of the arc corners.

At least one embodiment of the present disclosure further provides a display panel, the display panel comprises any one of the above array substrates.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1A:
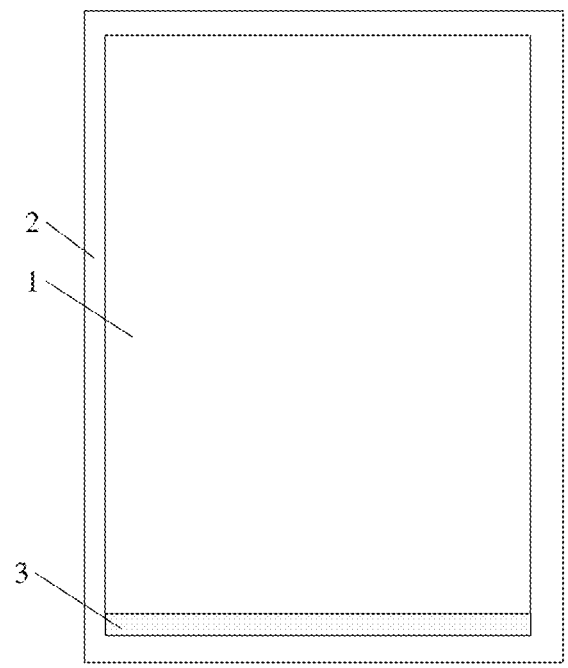
FIG. 1A is a schematic planar diagram of a display panel.

Generally speaking, as illustrated in FIG. 1A, a display panel includes a display region 1 and a peripheral region 2 around the display region 1, a pixel array is arranged in the display region 1, and circuit patterns are arranged in the peripheral region 2. The pixel array includes a plurality of sub-pixels and signal lines for the sub-pixels. These signal lines include, for example, gate lines, data lines, power lines, etc., generally, one gate line is provided for each row of sub-pixels, and one data line is provided for each column of sub-pixels. The peripheral region 2 is provided with the circuit patterns for providing corresponding signals for the gate lines and the data lines, for example, the circuit patterns include a gate driving circuit (a GOA circuit) for providing signals for the gate lines.

For example, the circuit patterns may be arranged in the lower frame 3 of the peripheral region. For example, a narrow frame can be achieved by simplifying the design of the circuit patterns arranged in the lower frame 3, thereby improving the screen ratio.

For example, multiplexing technology (MUX technology) may be used to simplify the circuit layout. The MUX technology connects a plurality of (e.g., 2) data lead lines in the peripheral region to one selection switch, and transmits electrical signals to different data lead lines through the selection switch and further to data lines through the data lead lines at different time, thereby reducing the number of wires in the peripheral region and reducing the space occupied by the circuit. For example, in the display panel, two signal lines may share the same signal channel, that is, the MUX 1:2 (i.e., an either-or selection circuit) setting method is adopted, so that the number of wires in the peripheral region can be changed to half of the original number, thereby reducing the space occupied by the wires and finally achieving the purpose of reducing the frame.

As illustrated in FIG. 1A, in the case where the shape of the display panel and the shape of the display region 1 are regular rectangle shapes, the pixel array is also correspondingly in a regular rectangle shape, and the circuit patterns arranged in the lower frame 3 are in a periodical and uniform arrangement and corresponding to sub-pixel columns of the pixel array in the column direction (vertical direction in the figure), respectively, that is, structures and arrangements of respective circuit patterns are the same, the interval between every two adjacent circuit patterns is also the same, each circuit pattern corresponds to two sub-pixel columns, and the width of each circuit pattern is substantially equal to the width of two sub-pixel columns.

In some cases, while achieving the narrow frame, in order to further improve the display effect of the display region and the overall aesthetics of the display panel, the frame of the display panel and corners of the display region gradually change from traditional square corners to irregular rounded corners. However, such design may affect the circuit arrangement in the peripheral region.

Figure 1B:
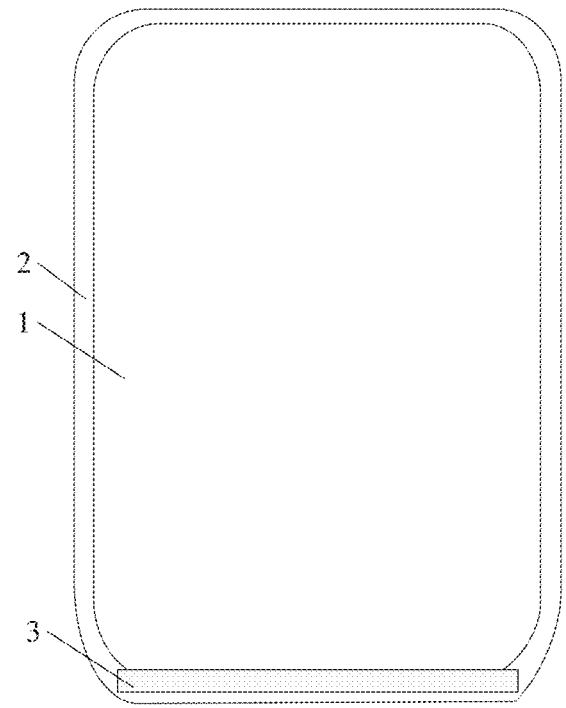
FIG. 1B is a schematic planar diagram of another display panel.

For example, as illustrated in FIG. 1B, in the case where the frame of the display panel and corners of the display region 1 become irregular rounded corners, the circuit arrangement space at the position of the irregular rounded corner is reduced, and therefore the above period and uniform design of circuit patterns in the lower frame 3 cannot be implemented at the position of the irregular rounded corner.

At least one embodiment of the present disclosure provides an array substrate and a display panel. In the array substrate, the space occupied by the circuit pattern near the corner of the display region is small, thereby satisfying the rounded design of the display region and achieving the narrow frame.

Hereinafter, the array substrate and the display panel provided by the embodiments of the present disclosure are described through some specific embodiments.

Figure 2A:
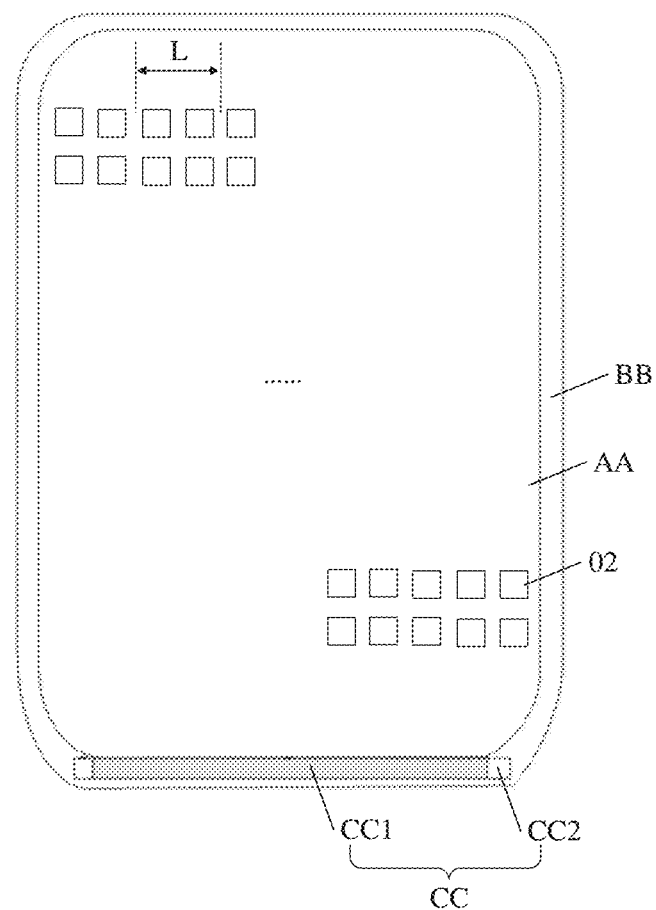
FIG. 2A is a schematic planar diagram of an array substrate provided by at least an embodiment of the present disclosure.
Figure 3:
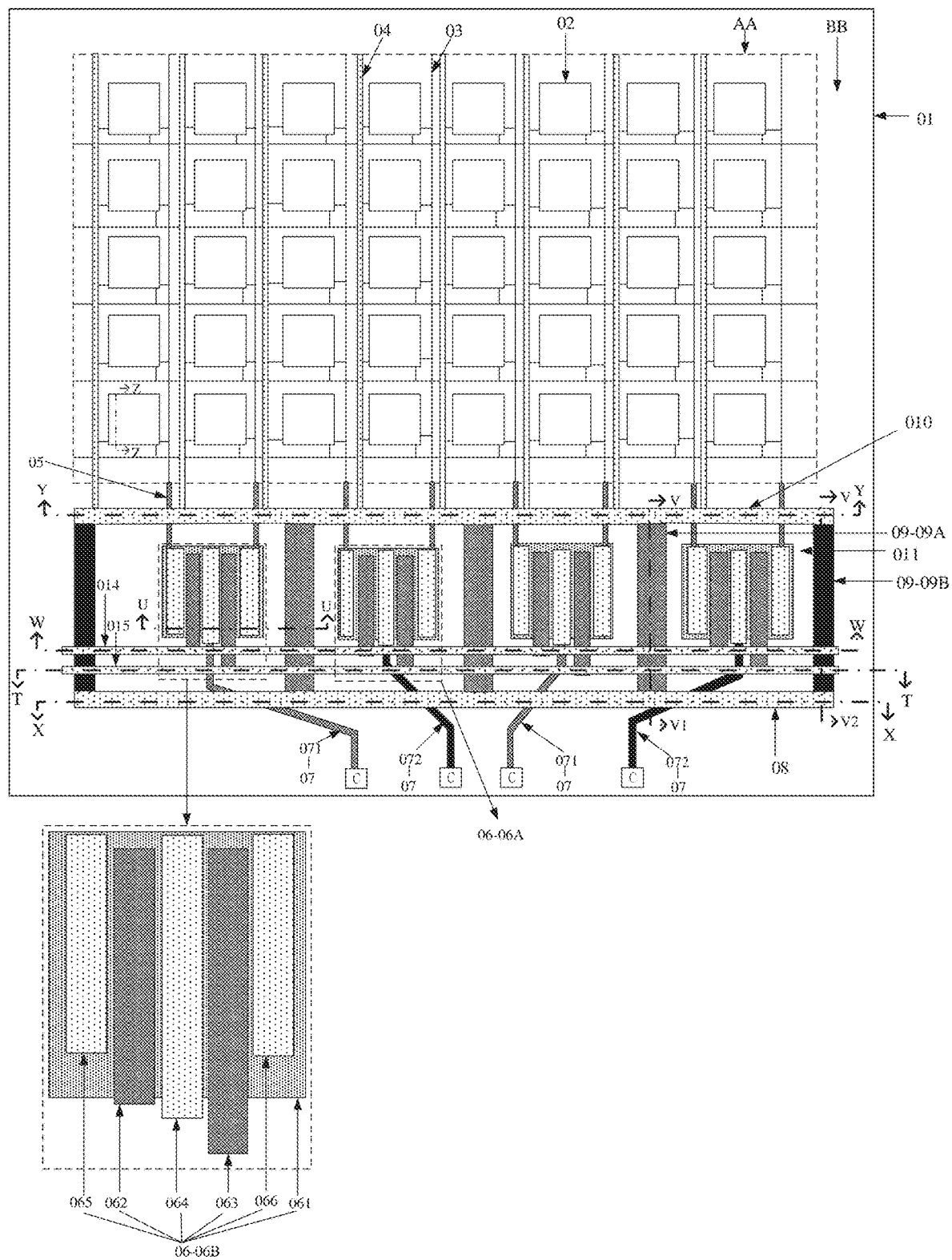
FIG. 3 is a schematic planar diagram of another array substrate provided by at least an embodiment of the present disclosure.
Figure 4A:
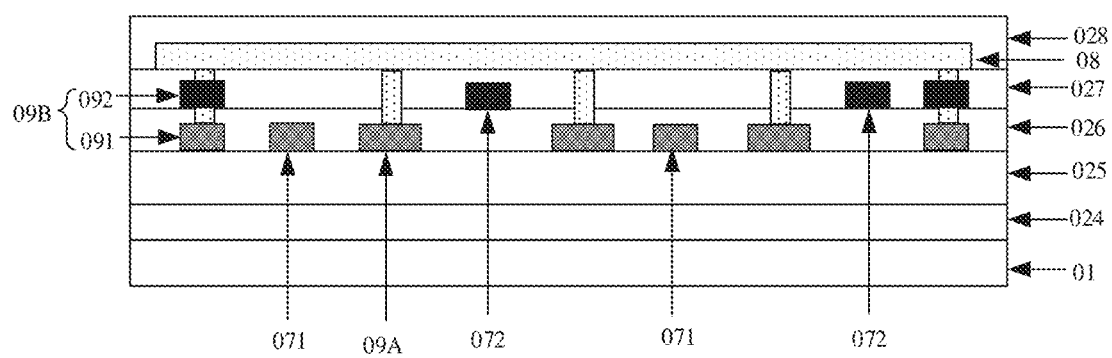
FIG. 4A is a schematic cross-sectional diagram of the array substrate in FIG. 3 along a line XX.
Figure 4B:
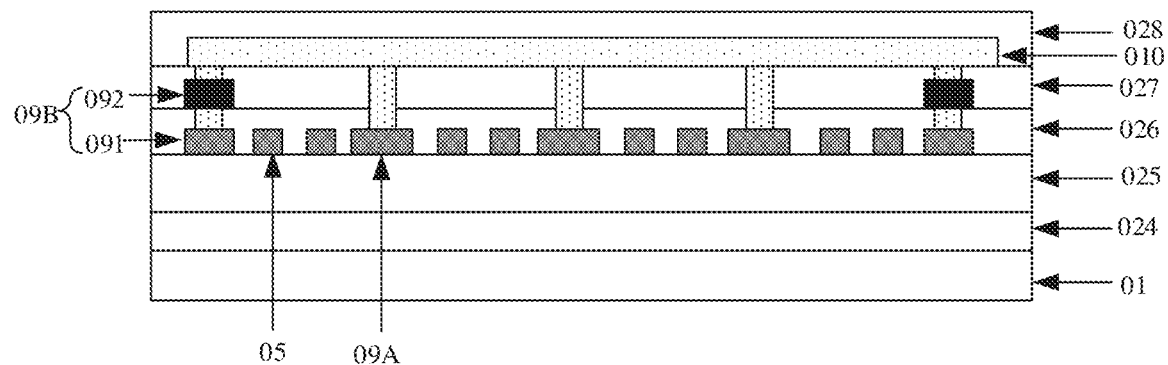
FIG. 4B is a schematic cross-sectional diagram of the array substrate in FIG. 3 along a line YY.
Figure 5:
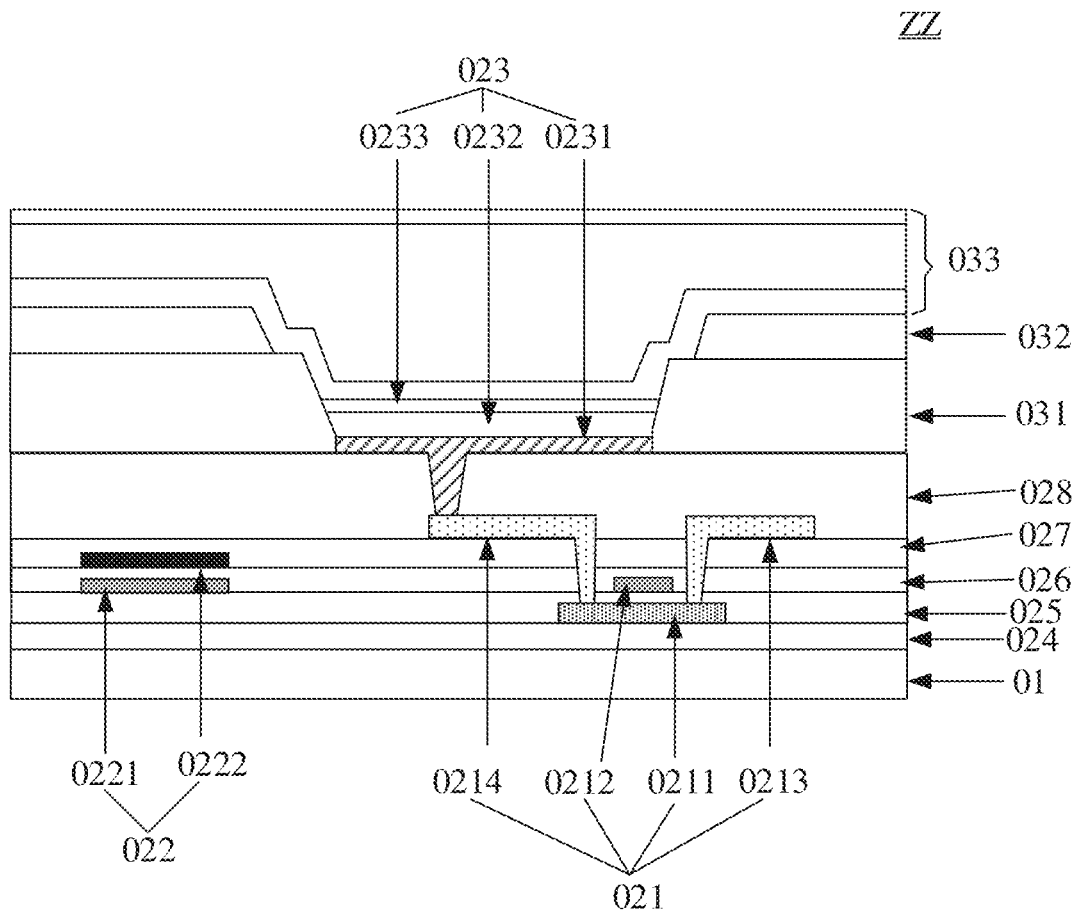
FIG. 5 is a schematic cross-sectional diagram of the array substrate in FIG. 3 along a line ZZ.
Figure 6:
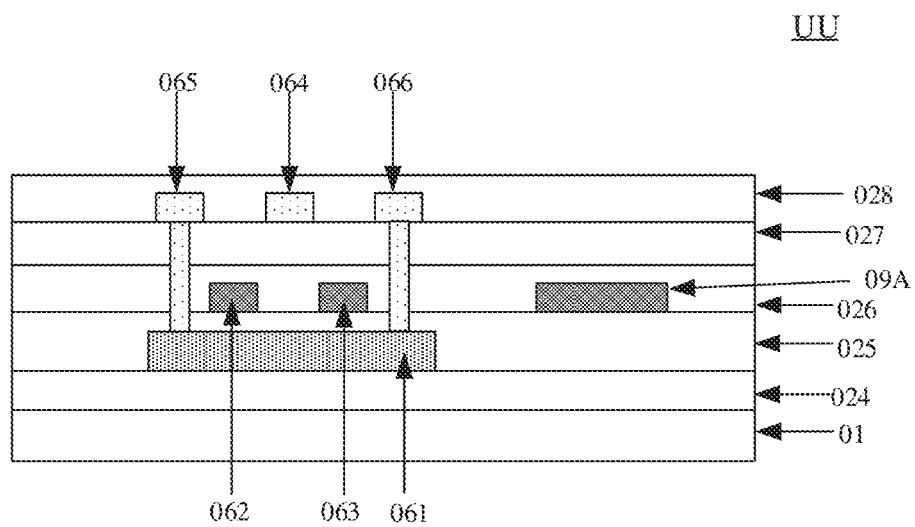
FIG. 6 is a schematic cross-sectional diagram of the array substrate in FIG. 3 along a line UU.
Figure 7A:
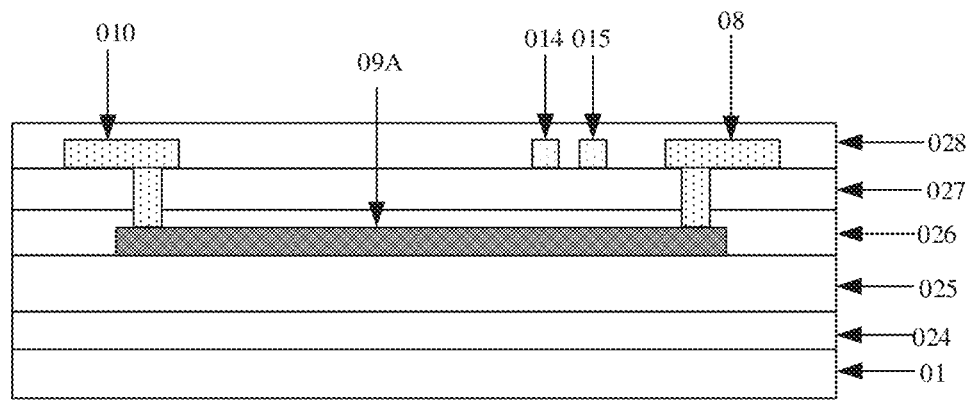
FIG. 7A is a schematic cross-sectional diagram of the array substrate in FIG. 3 along a line VV1.
Figure 7B:
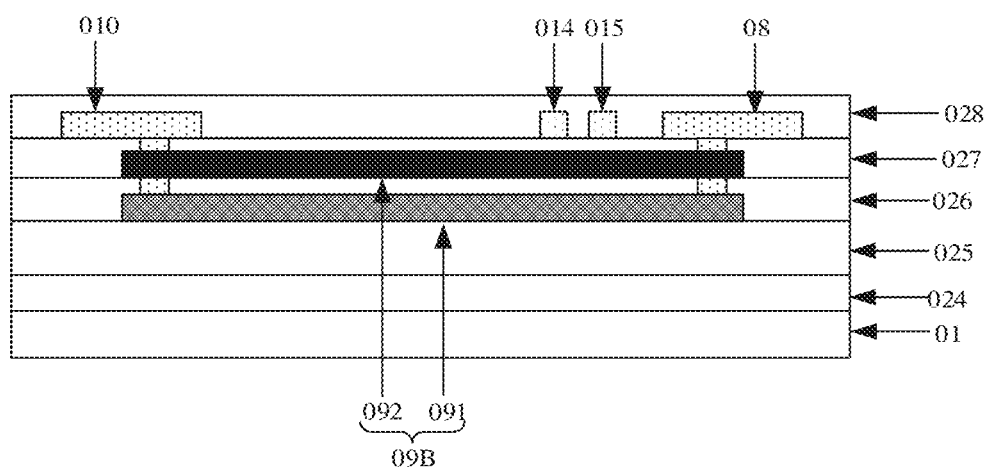
FIG. 7B is a schematic cross-sectional diagram of the array substrate in FIG. 3 along a line VV2.
Figure 8A:
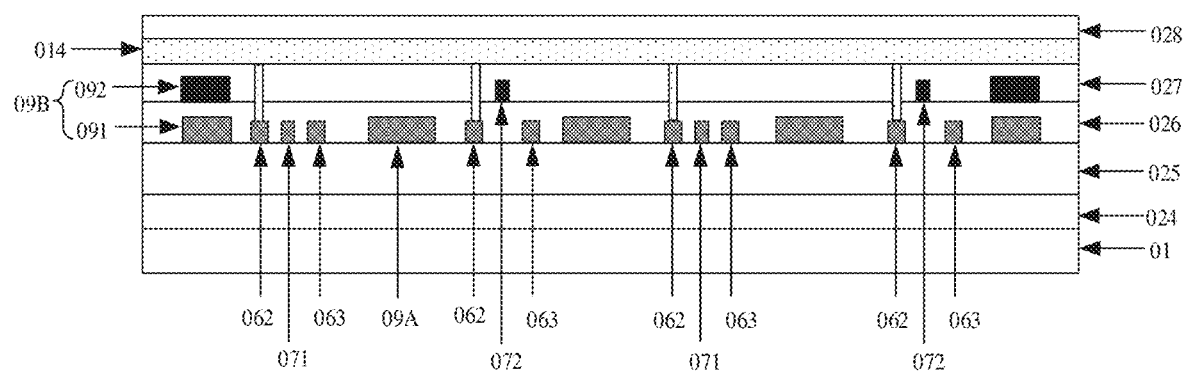
FIG. 8A is a schematic cross-sectional diagram of the array substrate in FIG. 3 along a line WW.
Figure 8B:
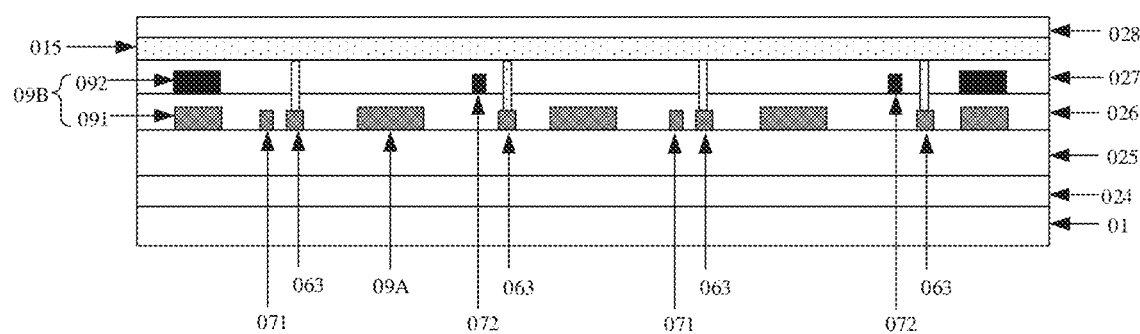
FIG. 8B is a schematic cross-sectional diagram of the array substrate in FIG. 3 along a line TT.

At least one embodiment of the present disclosure provides an array substrate. FIG. 2A is a schematic planar diagram of the array substrate; FIG. 3 is a schematic planar diagram of the specific structure of the array substrate; FIG. 4A is a schematic cross-sectional diagram of the array substrate in FIG. 3 along a line XX; FIG. 4B is a schematic cross-sectional diagram of the array substrate in FIG. 3 along a line YY; FIG. 5 is a schematic cross-sectional diagram of the array substrate in FIG. 3 along a line ZZ; FIG. 6 is a schematic cross-sectional diagram of the array substrate in FIG. 3 along a line UU; FIG. 7A is a schematic cross-sectional diagram of the array substrate in FIG. 3 along a line VV1; FIG. 7B is a schematic cross-sectional diagram of the array substrate in FIG. 3 along a line VV2; FIG. 8A is a schematic cross-sectional diagram of the array substrate in FIG. 3 along a line WW; and FIG. 8B is a schematic cross-sectional diagram of the array substrate in FIG. 3 along a line TT.

As illustrated in FIG. 2A to FIG. 8B, the array substrate includes:

a base substrate 01, including a display region AA and a peripheral region located at least on one side of the display region AA, where the embodiments take the peripheral region BB located around the display region AA as an example for description;

a plurality of sub-pixels 02, located in the display region AA, in which the plurality of sub-pixels 02 can emit light to implement the display function;

a plurality of data lines 03, located in the display region AA and configured to provide data signals for the plurality of sub-pixels 02;

a plurality of first power lines 04, located in the display region AA and configured to provide power signals for the plurality of sub-pixels 02;

a plurality of data lead lines 05, located in the peripheral region BB and electrically connected to the plurality of data lines 03, respectively, for transmitting the data signals for the plurality of data lines 03;

a plurality of selection switches 06, located in the peripheral region BB and arranged at intervals, in which the plurality of selection switches 06 are located on a side of the plurality of data lead lines 05 away from the display region AA, at least one of the plurality of selection switches 06 is electrically connected to at least two data lead lines 05 of the plurality of data lead lines 05, the plurality of selection switches 06 can selectively transmit the data signals to the plurality of data lines 03, and the embodiments take each selection switch 06 connected to two data lead lines 05 as an example for description;

a plurality of data signal input lines 07, located in the peripheral region BB and on a side of the plurality of selection switches 06 away from the display region AA, in which at least one of the plurality of selection switches 06 is electrically connected to one of the plurality of data signal input lines 07, and the embodiments take each selection switch 06 connected to one data signal input line 07 as an example for description;

a first power bus 08, located in the peripheral region BB and on a side of the plurality of selection switches 06 away from the display region AA for supplying power to the sub-pixels 02; and a plurality of connection portions 09, electrically connecting the first power bus 08 to the plurality of first power lines 04, respectively, in which the plurality of connection portions 09 extend along a region between the plurality of selection switches 06, and the plurality of connection portions 09 include a plurality of first connection portions 09A and a plurality of second connection portions 09B located on both sides of the plurality of first connection portions 09A, so that the first power bus 08 can be connected to the sub-pixels 02 in the display region AA through the above-mentioned plurality of connection portions 09 and the plurality of first power lines 04 to implement power supply to the sub-pixels 02.

For example, corresponding to FIG. 2A, the plurality of first connection portions 09A are located in a center portion CC1 of the lower frame CC of the peripheral region BB, and the plurality of second connection portions 09B are located in edge portions CC2 of the lower frame CC of the peripheral region BB.

For example, in an extending direction of an edge of the display region AA adjacent to the plurality of connection portions 09, that is, in the horizontal direction in the figure, the plurality of selection switches 06 and the plurality of connection portions 09 are arranged alternately, one connection portion 09 is arranged between two adjacent selection switches 06, and one selection switch 06 is arranged between two adjacent connection portions 09.

For example, one selection switch 06 and one connection portion that are adjacent are taken as an arrangement period, and a width of a first arrangement period formed by one first connection portion 09A and one selection switch 06 that are adjacent is greater than a width of a second arrangement period formed by one second connection portion 09B and one selection switch 06 that are adjacent.

Figure 2B:
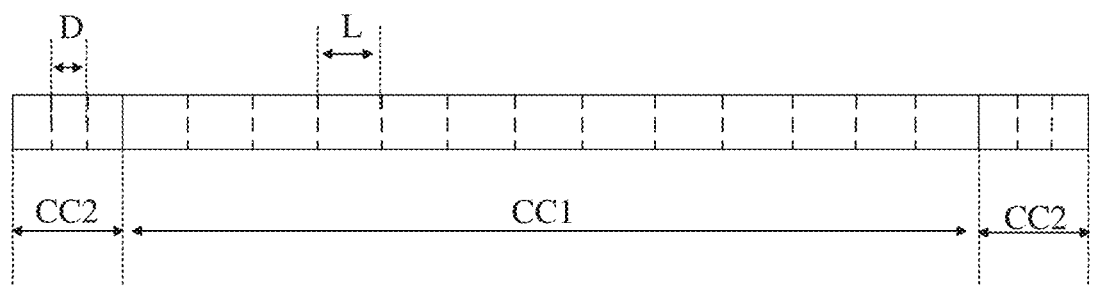
FIG. 2B is a schematic diagram of a circuit arrangement period in an array substrate provided by at least an embodiment of the present disclosure.

For example, with reference to FIG. 2B, each rectangular frame represents an arrangement space of one connection portion 09 and one selection switch 06 that are adjacent. In the center portion CC1 of the lower frame CC of the peripheral region BB, the width of the first arrangement period formed by one first connection portion 09A and one selection switch 06 that are adjacent is L; and in the edge portions CC2 of the lower frame CC of the peripheral region BB, the width of the second arrangement period formed by one second connection portion 09B and one selection switch 06 that are adjacent is D, and L is greater than D. Therefore, even in the case where the edge portions CC2 are narrow, more circuit patterns can be arranged.

For example, in the above embodiments, the width L of the first arrangement period formed by one first connection portion 09A and one selection switch 06 that are adjacent in the center portion CC1 is equal to the width of two adjacent columns of sub-pixels, and as illustrated in FIG. 2A, the width D of the second arrangement period formed by one second connection portion 09B and one selection switch 06 that are adjacent in the edge portions CC2 is smaller than the width of two adjacent columns of sub-pixels. Thus, the arrangement space of the second connection portion 09B and the selection switch 06 in the edge portions CC2 is smaller than the arrangement space of the first connection portion 09A and the selection switch 06 in the center portion CC1.

For example, in some embodiments, the first connection portion 09A and the second connection portion 09B may be designed differently, so that the space occupied by the second connection portion 09B is smaller than the space occupied by the first connection portion 09A, and the second connection portion 09B can be arranged in a narrow region, for example, arranged in the region of the corner of the display panel, thereby achieving the rounded design of the display region and achieving the narrow frame.

For example, in the extending direction of the edge of the display region AA adjacent to the plurality of connection portions 09, that is, in the horizontal direction in the figure, the width of the first connection portion 09A is greater than the width of the second connection portion 09B. Thus, the space occupied by the second connection portion 09B is narrow, and the second connection portion 09B can be arranged in the narrow space. For example, the second connection portion 09B may be designed with multi-layer wiring to reduce the space occupied by the second connection portion 09B.

For example, the second connection portion 09B includes at least two sub-connection portions provided in different layers. For example, the at least two sub-connection portions are connected in parallel, for example, in a direction perpendicular to the base substrate 01, orthographic projections of the at least two sub-connection portions on the base substrate 01 at least partially overlap with each other, and the at least two sub-connection portions are electrically connected through a via. Therefore, based on the multi-layer wiring design, the width of the second connection portion 09B can be reduced, thereby narrowing the width; and in addition, under the same width, the parallel connection of sub-power lines in different layers can reduce the resistance of the power line, thereby reducing the voltage drop of the power line: to ensure the long-range uniformity of the array substrate.

For example, in some embodiments, the plurality of selection switches 06 include a plurality of first selection switches 06A and a plurality of second selection switches 06B located on both sides of the plurality of first selection switches 06A. For example, the plurality of first selection switches 06A are located in the center portion CC1 of the lower frame CC of the peripheral region BB, and the plurality of second selection switches 06B are located in the edge portions CC2 of the lower frame CC of the peripheral region BB. In the extending direction of the edge of the display region AA adjacent to the plurality of connection portions 09, that is, in the horizontal direction in the figure, the width of the first selection switch 06A is smaller than the width of the second selection switch 06B. This design also enables more circuit patterns to be arranged in the narrow edge portions CC2.

The array substrate provided by the embodiments of the present disclosure can reduce the space occupied by the circuit patterns in the edge portions CC2 by designing the circuit patterns at different positions, thereby achieving the narrow frame design. In addition, the design can also achieve the irregular edge, and for example, the corners of the array substrate may be designed into arc corners or the like to improve the display effect and aesthetics.

For example, in some embodiments, as illustrated in FIG. 3, the array substrate further includes a second power bus 010 located between the plurality of selection switches 06 and the display region AA, and both ends of at least one connection portion 09 (e.g., each connection portion 09) of the plurality of connection portions 09 are electrically connected to the first power bus 08 and the second power bus 010, respectively.

For example, as illustrated in FIG. 3, the first power bus 08, the second power bus 010, and the plurality of connection portions 09 define a plurality of first openings 011 arranged in an array, and orthographic projections of the plurality of selection switches 06 on the base substrate 01 are located within orthographic projections of the plurality of first openings 011 on the base substrate 01, respectively. Therefore, the first power bus 08, the second power bus 010, and the connection portion 09 do not have a portion overlapping with the selection switch 06, thereby preventing or reducing the generation of parasitic capacitance, and allowing power signals to be effectively transmitted to the sub-pixels 02 in the display region AA.

For example, in some embodiments, as illustrated in FIG. 3, FIG. 4A, FIG. 4B, and FIG. 7B, the second connection portion 09B includes a first sub-connection portion 091 and a second sub-connection portion 092 provided in different layers. The first sub-connection portion 091 and the second sub-connection portion 092 are connected in parallel, and both ends of the first sub-connection portion 091 and both ends of the second sub-connection portion 092 are further electrically connected to the first power bus 08 and the second power bus 010 through vias, respectively. For example, an orthographic projection of the first sub-connection portion 091 on the base substrate 01 at least partially overlaps with an orthographic projection of the second sub-connection portion 092 on the base substrate 01.

For example, a second gate insulating layer 026 (described in detail later) is provided between the first sub-connection portion 091 and the second sub-connection portion 092, an interlayer dielectric layer 027 (described in detail later) is provided between the second sub-connection portion 092 and the first power bus 08 or the second power bus 010, the second gate insulating layer 026 and the interlayer dielectric layer 027 are provided with vias, respectively, the first sub-connection portion 091 and the second sub-connection portion 092 are electrically connected through the via in the second gate insulating layer 026, and the second sub-connection portion 092 and the first power bus 08, or the second sub-connection portion 092 and the second power bus 010 are electrically connected through the via in the interlayer dielectric layer 027.

For example, in some embodiments, as illustrated in FIG. 3, FIG. 4A, FIG. 4B, and FIG. 7A, the first connection portion 09A may be a single-layer wiring. For example, in some examples, the first connection portion 09A and the first sub-connection portion 091 are located in an identical layer. In this case, both ends of the first connection portion 09A are electrically connected to the first power bus 08 and the second power bus 010 through vias in the second gate insulating layer 026 and the interlayer dielectric layer 027, respectively. Thus, the first power bus 08 and the second power bus 010 can transmit power signals to the sub-pixels 02 in the display region AA together. For example, in other embodiments, the first connection portion 09A may be located in the same layer as the second sub-connection portion 092, and in this case, both ends of the first connection portion 09A are electrically connected to the first power bus 08 and the second power bus 010 through vias in the interlayer dielectric layer 027, respectively.

For example, as illustrated in FIG. 3 and FIG. 5, at least one sub-pixel 02 (for example, each sub-pixel 02) of the plurality of sub-pixels 02 includes a driving thin film transistor 021 and a storage capacitor 022. For example, the driving thin film transistor 021 includes a driving active layer 0211 on the base substrate 01, a driving gate electrode 0212 on a side of the driving active layer 0211 away from the base substrate 01, a gate insulating layer (for example, including a first gate insulating layer 025 and a second gate insulating layer 026) on a side of the driving gate electrode 0212 away from the base substrate 01, an interlayer dielectric layer 027 on a side of the gate insulating layer away from the base substrate 01, and a driving source electrode 0213 and a driving drain electrode 0214 on a side of the interlayer dielectric layer 027 away from the base substrate 01. For example, the storage capacitor 022 includes a first capacitor electrode 0211 and a second capacitor electrode 0222, the first capacitor electrode 0211 and the driving gate electrode 0:212 are located in an identical layer, and the second capacitor electrode 0222 is located between the gate insulating layer (e.g., the second gate insulating layer 026) and the interlayer dielectric layer 027.

For example, the sub-pixel 02 further includes a light-emitting diode 023, and the light-emitting diode 023 includes a first electrode 0231, a light-emitting layer 0232, and a second electrode 0233 which are sequentially arranged in a direction away from the base substrate 01, When a voltage is applied between the first electrode 0231 and the second electrode 0233, the light-emitting layer 0232 can emit light. For example, the first electrode 0231 of the light-emitting diode 023 is electrically connected to the driving drain electrode 0214, so that the thin film transistor can control the light-emitting state of the light-emitting diode 023.

For example, in some embodiments, the sub-pixel 02 may further include: a buffer layer 024 on the base substrate 01, a planarization layer 028 covering the driving source electrode 0213 and the driving drain electrode 0214, a pixel definition layer 031 for defining the plurality of sub-pixels 02, a support layer 032, an encapsulation layer 033, and other functional structures. For example, the pixel definition layer 031 includes a plurality of openings corresponding to the plurality of sub-pixels 02, respectively, and the light-emitting diodes 023 are formed in the plurality of openings, respectively. For example, the encapsulation layer 033 may include a plurality of encapsulation sub-layers, such as three encapsulation sub-layers illustrated in the figure. For example, the three encapsulation sub-layers include a first inorganic encapsulation sub-layer, an organic encapsulation sub-layer, and a second inorganic encapsulation sub-layer which are stacked to enhance the encapsulation effect of the encapsulation layer 033.

For example, the gate insulating layer (including the first gate insulating layer 025 and the second gate insulating layer 026), the interlayer dielectric layer 027, the buffer layer 024, the planarization layer 028, the pixel definition layer 031, the support layer 032, and the encapsulation layer 033 are all formed of insulating materials, and according to requirements, organic insulating materials, such as polyimide, resin materials, or the like, may be selected, and alternatively, inorganic insulating materials, such as silicon oxide, silicon nitride, silicon oxynitride, or the like, may also be selected. The embodiments of the present disclosure do not specifically limit the material of each functional layer.

For example, the first sub-connection portion 091 of the second connection portion 09B and the driving gate electrode 0212 are in an identical layer, and the second sub-connection portion 092 of the second connection portion 09B and the second capacitor electrode 0222 are in an identical layer.

It should be noted that, in the embodiments of the present disclosure, a plurality of structures located in an identical/same layer means that the plurality of structures can be formed by the same material layer through the patterning process in the manufacturing process, thereby simplifying the manufacturing process of the array substrate.

For example, the first sub-connection portion 091 and the driving gate electrode 0212 may be formed by patterning the same conductive layer, and the second sub-connection portion 092 and the second capacitor electrode 0222 may be formed by patterning the same conductive layer. For example, the material of the conductive layer may include metal materials such as aluminum, molybdenum, and titanium, or alloy materials, and may also include metal oxides, such as indium tin oxide (ITO) and the like. The embodiments of the present disclosure do not limit the material of each functional layer.

For example, the first connection portion 09A, the driving gate electrode 0212, and the first sub-connection portion 091 are located in an identical layer, that is, the first connection portion 09A, the driving gate electrode 0212, and the first sub-connection portion 091 can be formed by patterning the same conductive layer to simplify the manufacturing process of the array substrate.

For example, the first power bus 08, the second power bus 010, the driving source electrode 0213, and the driving drain electrode 0214 are located in an identical layer, that is, the first power bus 08, the second power bus 010, the driving source electrode 0213, and the driving drain electrode 0214 can be formed by patterning the same conductive layer to simplify the manufacturing process of the array substrate.

For example, in some embodiments, as illustrated in FIG. 4A and FIG. 4B, in the extending direction of the edge of the display region AA adjacent to the plurality of connection portions 09, that is, in the horizontal direction in the figure, in the second connection portion 09B, a width of the first sub-connection portion 091 is identical to a width of the second sub-connection portion 092, and is a first width, a width of the first connection portion 09A is a second width, and the first width is smaller than the second width, so that the space occupied by the second connection portion 09B is smaller than the space occupied by the first connection portion 09A.

For example, in some examples, the first width is half of the second width, so that the space occupied by the second connection portion 09B is half of the space occupied by the first connection portion 09A. In this case, the second connection portion 09B including the first sub-connection portion 091 and the second sub-connection portion 092 has substantially the same resistance as the first connection portion 09A, and therefore the first connection portion 09A and the second connection portion 09B can achieve substantially the same technical effect, that is, the first connection portion 09A and the second connection portion 09B have substantially the same signal transmitting performance.

For example, in some examples, in the extending direction of the edge of the display region AA adjacent to the plurality of connection portions 09, that is, in the horizontal direction in the figure, the first width of the first sub-connection portion 091 and the second sub-connection portion 092 is about 7 μm to 13 μm, for example, about 10 μm or the like. The width of the first connection portion 09A is about 1 μm to 25 μm, for example, about 20 μm or the like. Thus, the width of the second connection portion 09B can be reduced by about 10 μm compared to the width of the first connection portion 09A. When the number of circuits arranged in the edge portions CC2 is large, the multi-layer wiring design of the second connection portion 09B can significantly reduce the layout space of the second connection portion 09B.

For example, in some embodiments, as illustrated in FIG. 3 and FIG. 6, the selection switch 06 includes:

a first active layer 061 on the base substrate 01;

a first gate electrode 062 and a second gate electrode 063 located on a side of the first active layer 061 away from the base substrate 01, in which the first gate electrode 062 and the second gate electrode 063 are located in an identical layer and do not overlap with each other; and a first source electrode 064, a first drain electrode 065, and a second drain electrode 066 located on a side of the first gate electrode 062 and the second gate electrode 063 away from the base substrate 01, in which the first source electrode 064, the first drain electrode 065, and the second drain electrode 066 are located in an identical layer and do not overlap with each other, and the first source electrode 064 is located between the first drain electrode 065 and the second drain electrode 066.

For example, the first source electrode 064 is electrically connected to one data signal input line 07 of the plurality of data signal input lines 07, and each of the first drain electrode 065 and the second drain electrode 066 is electrically connected to one data lead line 05 of the plurality of data lead lines 05.

For example, the first active layer 061 and the driving active layer 0211 are located in an identical layer, so that the first active layer 061 and the driving active layer 0211 can be formed by patterning the same material layer in the manufacturing process. For example, the first gate electrode 062, the second gate electrode 063, and the driving gate electrode 0212 are located in an identical layer, so that the first gate electrode 062, the second gate electrode 063, and the driving gate electrode 0212 can be formed by patterning the same material layer in the manufacturing process. For example, the first source electrode 064, the first drain electrode 065, the second drain electrode 066, the driving source electrode 0213 and the driving drain electrode 0214 are located in an identical layer, so that the first source electrode 064, the first drain electrode 065, the second drain electrode 066, the driving source electrode 0213, and the driving drain electrode 0214 can be formed by patterning the same material layer in the manufacturing process. Therefore, the manufacturing process of the array substrate can be simplified.

For example, the array substrate may further include a first control line 014 and a second control line 015; the first control line 014 is electrically connected to the first gate electrode 062 through a via, and the second control line 015 is electrically connected to the second gate electrode 063 through a via; and orthographic projections of the first control line 014 and the second control line 015 on the base substrate 01 overlap with the orthographic projections of the plurality of first openings 011 on the base substrate 01. The first control line 014 and the second control line 015 can provide control signals for the selection switch 06 to implement the selection function of the selection switch 06. For example, the first control line 014 and the second control line 015 are located in the same layer as the driving source electrode 0213, the driving drain electrode 0214, the first source electrode 064, the first drain electrode 065, and the second drain electrode 066, so that the first control line 014, the second control line 015, the driving source electrode 0213, the driving drain electrode 0214, the first source electrode 064, the first drain electrode 065, and the second drain electrode 066 can be formed by patterning the same conductive layer in the manufacturing process.

For example, in some embodiments, as illustrated in FIG. 3, FIG. 4A, FIG. 8A, and FIG. 8B, the plurality of data signal input lines 07 include a first data signal input line 071 and a second data signal input line 072, the first data signal input line 071 and the second data signal input line 072 are alternately arranged, and the first data signal input line 071 and the second data signal input line 072 are located in different layers. In this way, the arrangement of the data signal input lines can be simplified, which can avoid that the data signal input lines are in a high-density arrangement in one layer to generate signal crosstalk between the data signal input lines.

For example, in some embodiments, the first data signal input line 071 is located in the same layer as the driving gate electrode 0212 and the first sub-connection portion 091, so that the first data signal input line 071, the driving gate electrode 0212, and the first sub-connection portion 091 can be formed by patterning the same conductive layer in the manufacturing process. For example, the second data signal input line 072 is located in the same layer as the second sub-connection portion 092, so that the second data signal input line 072 and the second sub-connection portion 092 can be formed by patterning the same conductive layer in the manufacturing process. Therefore, the manufacturing process of the array substrate can be simplified.

For example, in some embodiments, the plurality of data lines 03 are in the same layer as the driving source electrode 0213, the driving drain electrode 0214, the first source electrode 064, the first drain electrode 065, and the second drain electrode 066, so that the plurality of data lines 03, the driving source electrode 0213, the driving drain electrode 0214, the first source electrode 064, the first drain electrode 065, and the second drain electrode 066 can be formed by patterning the same conductive layer in the manufacturing process. Therefore, the manufacturing process of the array substrate can be simplified.

For example, in some embodiments, the plurality of data lead lines 05 are in the same layer as the driving gate electrode 0212, the first gate electrode 062, and the second gate electrode 063, so that the plurality of data lead lines 05, the driving gate electrode 0212, the first gate electrode 062, and the second gate electrode 063 can be formed by patterning the same conductive layer in the manufacturing process. Therefore, the manufacturing process of the array substrate can be simplified.

Hereinafter, the working principle of the array substrate provided by some embodiments of the present disclosure is exemplarily described in connection with the above structure of the array substrate.

For example, when the array substrate needs to display an image, power signals are transmitted through the first power bus 08 and the second power bus 010 in the array substrate. The power signals are transmitted to each of the sub-pixels 02 through the plurality of first power lines 04.

Signal source terminals (for example, a plurality of signal input pads C in FIG. 3) of the array substrate can input data signals to the plurality of selection switches 06 through the plurality of data signal input lines 07, respectively. When the signal source terminal inputs the data signal to a selection switch 06 through each data signal input line 07, the data signal is input to the first source electrode 064 of the selection switch. By cooperating with the control signals provided by the first control line 014 and the second control line 015, the data signal on the first source electrode 064 can be transmitted to two data lead lines 05 at different time, respectively. For example, a turn-on signal is applied to the first control line 014 first to allow the first source electrode 064 to be electrically connected to the first drain electrode 065, and in this case, the data signal on the first source electrode 064 is transmitted to one data line 03 through the first drain electrode 064 and one data lead line 05; and then, a turn-on signal is applied to the second control line 015 to allow the first source electrode 064 to be electrically connected to the second drain electrode 066, and in this case, the data signal on the first source electrode 064 is transmitted to another data line 03 through the second drain electrode 066 and another data lead line 05. After the data signal is applied to each data line 03, the sub-pixel connected to each data line 03 also receives the data signal. For example, after each sub-pixel 02 receives the power signal and the data signal, the power signal and the data signal cooperate with other electrical signals to achieve the purpose of the array substrate displaying the image.

In the embodiments of the present disclosure, when the shape of the portion of the display region or the shape of the edge of the array substrate corresponding to the edge portions CC2 is irregular so that the space of the edge portion CC2 is small (for example, the width in the horizontal direction in the figure is small), the circuit structure provided by the embodiments of the present disclosure is beneficial to the circuit arrangement in the edge portions CC2.

For example, in some embodiments, as illustrated in FIG. 2A, the array substrate has an arc-shaped edge, and the second connection portion 09B is disposed in the peripheral region close to the arc-shaped edge, for example, disposed in the edge portions CC2 of the lower frame. For example, in one example, the planar shape of the array substrate is a rectangle shape, four corners of the rectangle shape are arc corners, and the second connection portion 09B is located in a region of the arc corners. Because the space occupied by the second connection portion 09B is small, the second connection portion 09B can be arranged in a small and irregular region, such as the arc-shaped edge or the arc corner, thereby satisfying the rounded design of the display region and achieving the narrow frame.

For example, in some embodiments, in addition to the second connection portion 09B located in the edge portions CC2 of the lower frame CC designed with multi-layer wiring, the first connection portion 09A located in the center portion CC1 of the lower frame CC can also be designed with multi-layer wiring. For example, the first connection portion 09A includes at least two sub-connection portions provided in different layers, and for example, the at least two sub-connection portions are connected in parallel.

For example, in some examples, the first connection portion 09A includes a third sub-connection portion and a fourth sub-connection portion provided in different layers, and for example, the third sub-connection portion and the fourth sub-connection portion are electrically connected through a via. For example, the third sub-connection portion and the first sub-connection portion 091 are in an identical layer, and the fourth sub-connection portion and the second sub-connection portion 092 are in an identical layer. In this way, the first connection portion 09A and the second connection portion 09B have the same or similar structure. Thus, the plurality of sub-pixels 02 of the array substrate can be selected and driven by substantially the same circuit, and the display uniformity of the array substrate can also be improved to a certain extent.

Figure 9A:
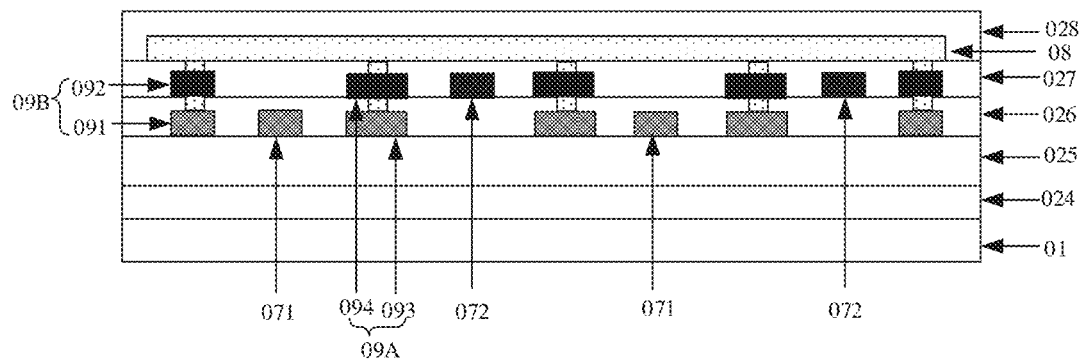
FIG. 9A is another schematic cross-sectional diagram of the array substrate in FIG. 3 along the line XX.
Figure 9B:
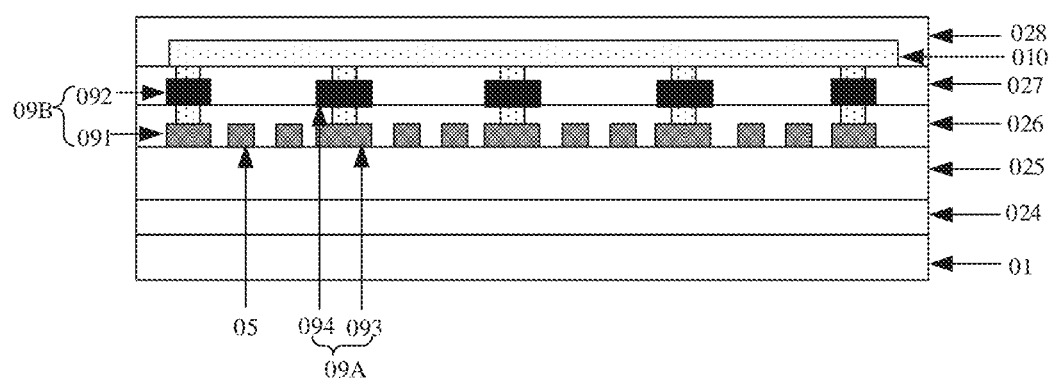
FIG. 9B is another schematic cross-sectional diagram of the array substrate in FIG. 3 along the line YY.
Figure 10:
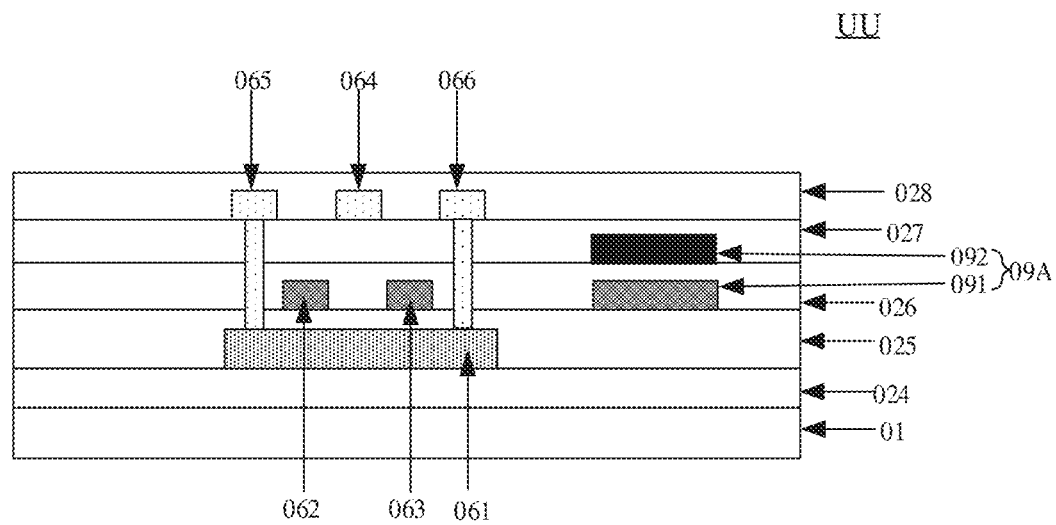
FIG. 10 is another schematic cross-sectional diagram of the array substrate in FIG. 3 along the line UU.
Figure 11:
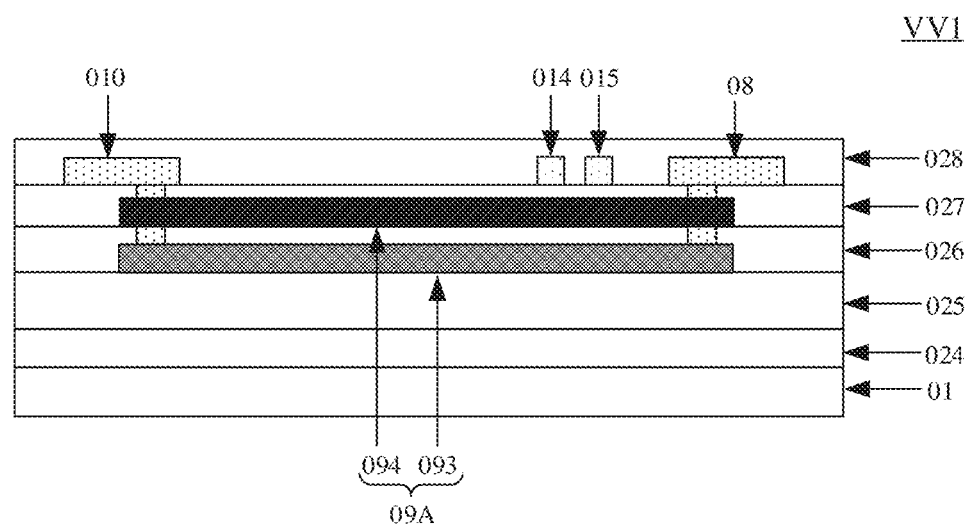
FIG. 11 is another schematic cross-sectional diagram of the array substrate in FIG. 3 along the line VV1.
Figure 12A:
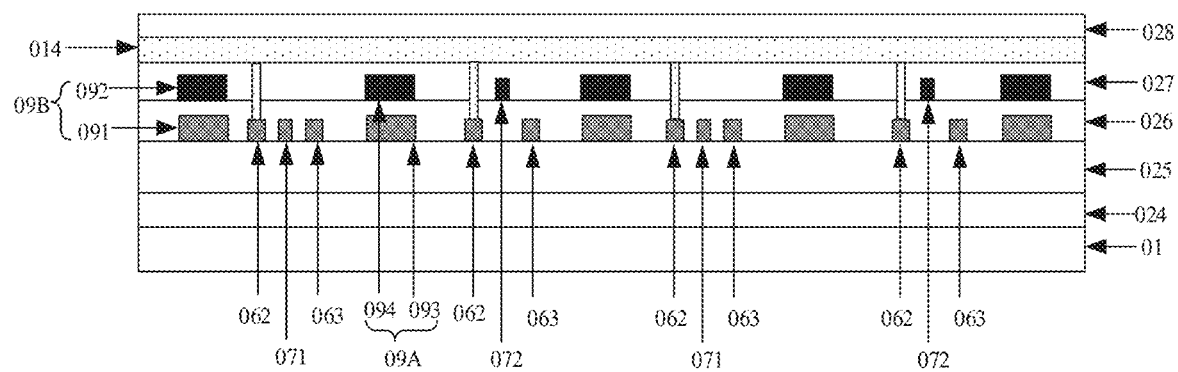
FIG. 12A is another schematic cross-sectional diagram of the array substrate in FIG. 3 along the line WW.
Figure 12B:
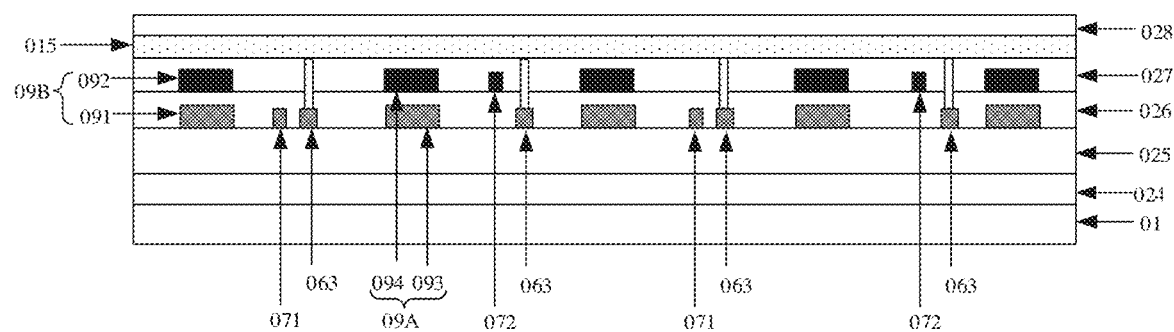
FIG. 12B is another schematic cross-sectional diagram of the array substrate in FIG. 3 along the line TT.

For example, in the case where the first connection portion includes the third sub-connection portion and the fourth sub-connection portion provided in different layers, FIG. 9A illustrates a schematic cross-sectional diagram of the array substrate along the line XX in this case, FIG. 9B illustrates a schematic cross-sectional diagram of the array substrate along the line YY in this case, FIG. 10 illustrates a schematic cross-sectional diagram of the array substrate along the line UU in this case, FIG. 11 illustrates a schematic cross-sectional diagram of the array substrate along the line VV1 in this case, FIG. 12A illustrates a schematic cross-sectional diagram of the array substrate along the line WW in this case, and FIG. 12B illustrates a schematic cross-sectional diagram of the array substrate along the line TT in this case.

For example, as illustrated in FIG. 9A to FIG. 12B, the first connection portion 09A includes the third sub-connection portion 093 and the fourth sub-connection portion 094 connected in parallel and provided in different layers. For example, in the direction perpendicular to the base substrate 01, an orthographic projection of the third sub-connection portion 093 on the base substrate 01 at least partially overlaps with an orthographic projection of the fourth sub-connection portion 094 on the base substrate 01, and the third sub-connection portion 093 and the fourth sub-connection portion 094 are electrically connected through a via. For example, in the extending direction of the edge of the display region AA adjacent to the plurality of connection portions 09, that is, in the horizontal direction in the figure, a width of the first sub-connection portion 091 is identical to a width of the second sub-connection portion 092, and is a first width, a width of the third sub-connection portion 093 is identical to a width of the fourth sub-connection portion 094, and is a third width, and the first width is smaller than or equal to the third width (the first width is illustrated to be equal to the third width in the figure). Therefore, the space occupied by the first connection portion 09A can be reduced.

For example, an orthographic projection of the first sub-connection portion 091 on the base substrate 01 at least partially overlaps with an orthographic projection of the second sub-connection portion 092 on the base substrate 01, and an orthographic projection of the third sub-connection portion 093 on the base substrate 01 at least partially overlaps with an orthographic projection of the fourth sub-connection portion 094 on the base substrate 01.

For example, the third sub-connection portion 093 and the fourth sub-connection portion 094 included in the first connection portion 09A have substantially the same structure as the first sub-connection portion 091 and the second sub-connection portion 092 included in the second connection portion 09B.

For example, as illustrated in FIG. 9A, FIG. 9B, and FIG. 11, both ends of the third sub-connection portion 093 and both ends of the fourth sub-connection portion 094 are electrically connected to the first power bus 08 and the second power bus 010 through vias, respectively. For example, the second gate insulating layer 026 and the interlayer dielectric layer 027 are provided with vias, respectively, the third sub-connection portion 093 and the fourth sub-connection portion 094 are electrically connected through the via in the second gate insulating layer 026, and the fourth sub-connection portion 094 is electrically connected to the first power bus 08 or the second power bus 010 through the via in the interlayer dielectric layer 027. Therefore, the third sub-connection portion 093 and the fourth sub-connection portion 094 electrically connect the first power bus 08 and the second power bus 010, and the first power bus 08 and the second power bus 010 can transmit power signals to the sub-pixels 02 in the display region AA together.

The other structures and connection relationships of the third sub-connection portion 093 and the fourth sub-connection portion 094 may be with reference to the first sub-connection portion 091 and the second sub-connection portion 092 in the above embodiments, and details are not described herein again.

At least one embodiment of the present disclosure further provides a display panel, and the display panel includes any one of the above array substrates. For example, the display panel may be a self-luminous display panel such as an OLED display panel or a QLED display panel, or may be a non-self-luminous display panel such as an LCD panel. The embodiments of the present disclosure do not limit the type of the display panel.

For example, in the case where the display panel is an OLED display panel or a QLED display panel, the array substrate may be encapsulated to form the display panel.

For example, in the case where the display panel is an LCD panel, the display panel further includes an opposite substrate, the opposite substrate is disposed opposite to the array substrate, and liquid crystal materials are injected between the array substrate and the opposite substrate, thereby forming the LCD panel. For example, the opposite substrate is a color filter substrate, and includes a color filter layer for forming monochromatic light, a black matrix layer for shielding the light, and other structures. The embodiments of the present disclosure do not specifically limit the structure of the display panel.

The display panel provided by the embodiments of the present disclosure can have irregular-shaped corners such as arc-shaped corners, and can also achieve the narrow frame design to facilitate achieving a high screen ratio, thereby providing a better display effect.

At least one embodiment of the present disclosure further provides a display device, and the display device includes the above display panel. For example, the display device may be any product or component with a display function, such as a mobile phone, a tablet computer, a TV, a display, a notebook computer, a digital photo frame, a navigator, etc., and the embodiments of the present disclosure do not limit the specific form of the display device.

The following statements should be noted.

(1) The accompanying drawings involve only the structure(s) in connection with the embodiment(s) of the present disclosure, and other structures) can be referred to common design(s).

(2) For the purpose of clarity only, in accompanying drawings for illustrating the embodiment(s) of the present disclosure, the thickness a layer or a region may be enlarged or narrowed, that is, the drawings are not drawn in a real scale. It should understood that, in the case in which a component such as a layer, film, region, substrate, or the like is referred to be "on" or "under" another component, the component may be directly on or under the another component or a component may be interposed therebetween.

(3) in case of no conflict, features in one embodiment or in different embodiments can be combined to obtain new embodiments.

What have been described above are only specific implementations of the present disclosure, the protection scope of the present disclosure is not limited thereto, and the protection scope of the present disclosure should be based on the protection scope of the claims.

What is claimed is:

1. An array substrate, comprising:
    a base substrate comprising a display region and a peripheral region at least on one side of the display region;
    a plurality of sub-pixels in the display region;
    a plurality of data lines in the display region and configured to provide data signals for the plurality of sub-pixels;
    a plurality of first power lines in the display region and configured to provide power signals for the plurality of sub-pixels;
    a plurality of data lead lines in the peripheral region and electrically connected to the plurality of data lines, respectively;
    a plurality of selection switches in the peripheral region and arranged at intervals, wherein the plurality of selection switches are on a side of the plurality of data lead lines away from the display region, and at least one of the plurality of selection switches is electrically connected to at least two data lead lines of the plurality of data lead lines;
    a plurality of data signal input lines in the peripheral region and on a side of the plurality of selection switches away from the display region, wherein at least one of the plurality of selection switches is electrically connected to one of the plurality of data signal input lines;
    a first power bus in the peripheral region and on a side of the plurality of selection switches away from the display region; and
    a plurality of connection portions electrically connecting the first power bus to the plurality of first power lines, respectively, wherein the plurality of connection portions extend along a region between the plurality of selection switches, and the plurality of connection portions comprise a plurality of first connection portions and a plurality of second connection portions on both sides of the plurality of first connection portions.

2. The array substrate according to claim 1, wherein in an extending direction of an edge of the display region adjacent to the plurality of connection portions, a width of the first connection portion is greater than a width of the second connection portion.

3. The array substrate according to claim 1 or 2, wherein in an extending direction of an edge of the display region adjacent to the plurality of connection portions, the plurality of selection switches and the plurality of connection portions are arranged alternately, one connection portion is arranged between two adjacent selection switches, and one selection switch is arranged between two adjacent connection portions.

4. The array substrate according to claim 3, wherein one selection switch and one connection portion that are adjacent are taken as an arrangement period, and a width of a first arrangement period formed by one first connection portion and one selection switch that are adjacent is greater than a width of a second arrangement period formed by one second connection portion and one selection switch that are adjacent.

5. The array substrate according to claim 1, wherein the plurality of selection switches comprise a plurality of first selection switches and a plurality of second selection switches on both sides of the plurality of first selection switches, and
    in an extending direction of an edge of the display region adjacent to the plurality of connection portions, a width of the first selection switch is smaller than a width of the second selection switch.

6. The array substrate according to claim 1, wherein the second connection portion comprises at least two sub-connection portions in different layers.

7. The array substrate according to claim 1, wherein at least one of the plurality of sub-pixels comprises a driving thin film transistor and a storage capacitor;
    the driving thin film transistor comprises a driving active layer on the base substrate, a driving gate electrode on a side of the driving active layer away from the base substrate, a gate insulating layer on a side of the driving gate electrode away from the base substrate, an interlayer dielectric layer on a side of the gate insulating layer away from the base substrate, and a driving source electrode and a driving drain electrode on a side of the interlayer dielectric layer away from the base substrate; and
    the storage capacitor comprises a first capacitor electrode and a second capacitor electrode, the first capacitor electrode and the driving gate electrode are in an identical layer, and the second capacitor electrode is between the gate insulating layer and the interlayer dielectric layer;
    wherein the second connection portion comprises a first sub-connection portion and a second sub-connection portion in different layers, the first sub-connection portion and the driving gate electrode are in an identical layer, and the second sub-connection portion and the second capacitor electrode are in an identical layer.

8. The array substrate according to claim 7, wherein the plurality of first connection portions and the driving gate electrode are in an identical layer.

9. The array substrate according to claim 8, wherein in an extending direction of an edge of the display region adjacent to the plurality of connection portions, a width of the first sub-connection portion is identical to a width of the second sub-connection portion, and is a first width, and a width of the first connection portion is a second width,
the first width smaller than the second width.

10. The array substrate according to claim 9, wherein the first width is half of the second width.

11. The array substrate according to claim 7, wherein the first connection portion comprises a third sub-connection portion and a fourth sub-connection portion in different layers,
the third sub-connection portion and the first sub-connection portion are in an identical layer, and the fourth sub-connection portion and the second sub-connection portion are in an identical layer.

12. The array substrate according to claim 11, wherein in an extending direction of an edge of the display region adjacent to the plurality of connection portions, a width of the first sub-connection portion is identical to a width of the second sub-connection portion, and is a first width, and a width of the third sub-connection portion is identical to a width of the fourth sub-connection portion, and is a third width,
the first width is smaller than or equal to the third width;
an orthographic projection of the first sub-connection portion on the base substrate at least partially overlaps with an orthographic projection of the second sub-connection portion on the base substrate, and an orthographic projection of the third sub-connection portion on the base substrate at least partially overlaps with an orthographic projection of the fourth sub-connection portion on the base substrate.

13. The array substrate according to claim 7, further comprising a second power bus between the plurality of selection switches and the display region,
wherein both ends of at least one connection portion of the plurality of connection portions are electrically connected to the first power bus and the second power bus, respectively.

14. The array substrate according to claim 13, wherein the first power bus, the second power bus, and the plurality of connection portions define a plurality of first openings arranged in an array, and orthographic projections of the plurality of selection switches on the base substrate are within orthographic projections of the plurality of first openings on the base substrate, respectively.

15. The array substrate according to claim 13, wherein the first power bus, the second power bus, the driving source electrode, and the driving drain electrode are in an identical layer.

16. The array substrate according to claim 7, wherein the selection switch comprises:
a first active layer on the base substrate;
a first gate electrode and a second gate electrode on a side of the first active layer away from the base substrate, wherein the first gate electrode and the second gate electrode are in an identical layer and do not overlap with each other; and
a first source electrode, a first drain electrode, and a second drain electrode on a side of the first gate electrode and the second gate electrode away from the base substrate, wherein the first source electrode, the first drain electrode, and the second drain electrode are in an identical layer and do not overlap with each other, and the first source electrode is between the first drain electrode and the second drain electrode; and
the first source electrode is electrically connected to one data signal input line of the plurality of data signal input lines, and each of the first drain electrode and the second drain electrode is electrically connected to one data lead line of the plurality of data lead lines;
the first gate electrode, the second gate electrode, and the driving gate electrode are in an identical layer, and
the first source electrode, the first drain electrode, the second drain electrode, the driving source electrode, and the driving drain electrode are in an identical layer.

17. The array substrate according to claim 7, wherein the plurality of data lead lines and the driving gate electrode are in an identical layer.

18. The array substrate according to claim 1, wherein the plurality of data signal input lines comprise a first data signal input line and a second data signal input line, the first data signal input line and the second data signal input line are alternately arranged, and the first data signal input line and the second data signal input line are in different layers.

19. The array substrate according to claim 1, wherein the array substrate has an arc-shaped edge, and the second connection portion is in the peripheral region close to the arc-shaped edge, or
a planar shape of the array substrate is a rectangle shape, four corners of the rectangle shape are arc corners, and the second connection portion is in a region of the arc corners.

20. A display panel, comprising an array substrate, wherein the array substrate comprises:
a base substrate comprising a display region and a peripheral region at least on one side of the display region;
a plurality of sub-pixels in the display region;
a plurality of data lines in the display region and configured to provide data signals for the plurality of sub-pixels;
a plurality of first power lines in the display region and configured to provide power signals for the plurality of sub-pixels;
a plurality of data lead lines in the peripheral region and electrically connected to the plurality of data lines, respectively;
a plurality of selection switches in the peripheral region and arranged at intervals, wherein the plurality of selection switches are on a side of the plurality of data lead lines away from the display region, and at least one of the plurality of selection switches is electrically connected to at least two data lead lines of the plurality of data lead lines;
a plurality of data signal input lines in the peripheral region and on a side of the plurality of selection switches away from the display region, wherein at least one of the plurality of selection switches is electrically connected to one of the plurality of data signal input lines;
a first power bus in the peripheral region and on a side of the plurality of selection switches away from the display region; and
a plurality of connection portions electrically connecting the first power bus to the plurality of first power lines, respectively, wherein the plurality of connection portions extend along a region between the plurality of selection switches, and the plurality of connection portions comprise a plurality of first connection portions and a plurality of second connection portions on both sides of the plurality of first connection portions.

\* \* \* \* \*